United States Patent
Chen et al.

(10) Patent No.: US 10,304,865 B2
(45) Date of Patent: May 28, 2019

(54) PIXEL ARRAY SUBSTRATE WITH DISCONTINUOUS SELECTION LINES

(71) Applicant: E Ink Holdings Inc., Hsinchu (TW)

(72) Inventors: Yun-Han Chen, Hsinchu (TW); Po-Chun Chuang, Hsinchu (TW); Hsiao-Tung Chu, Hsinchu (TW); Pei-Lin Huang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/712,170

(22) Filed: Sep. 22, 2017

(65) Prior Publication Data

US 2018/0158838 A1    Jun. 7, 2018

(30) Foreign Application Priority Data

Dec. 7, 2016   (CN) .......................... 2016 1 1112401

(51) Int. Cl.
*H01L 27/12*   (2006.01)
*H01L 27/15*   (2006.01)
*H01L 21/66*   (2006.01)

(52) U.S. Cl.
CPC .......... *H01L 27/124* (2013.01); *H01L 27/156* (2013.01); *H01L 22/10* (2013.01); *H01L 27/1259* (2013.01); *H01L 27/153* (2013.01)

(58) Field of Classification Search
CPC ......... G09G 2300/0426; G09G 3/3648; G09G 2300/0413; G09G 2310/0281; G02F 1/136286; G02F 1/1345
See application file for complete search history.

(56) References Cited

U.S. PATENT DOCUMENTS

| | | | |
|---|---|---|---|
| 6,862,008 B2 * | 3/2005 | Yamazaki ........... | G02F 1/13454 345/62 |
| 7,688,392 B2 | 3/2010 | Wang et al. | |
| 7,989,810 B2 | 8/2011 | Miyasaka et al. | |
| 8,160,351 B2 | 4/2012 | Sandstrom et al. | |
| 8,363,192 B2 * | 1/2013 | Takahashi ........ | G02F 1/136286 349/139 |

(Continued)

FOREIGN PATENT DOCUMENTS

| TW | 201530240 A | 8/2015 |
|---|---|---|
| TW | 201530522 A | 8/2015 |

OTHER PUBLICATIONS

Corresponding Taiwan office action dated Dec. 13, 2017.

*Primary Examiner* — John P. Dulka
(74) *Attorney, Agent, or Firm* — CKC & Partners Co., LLC

(57) ABSTRACT

A pixel array substrate includes a substrate, first signal lines, second signal lines, active elements, pixel electrodes, selection lines, a driving unit, and metal lines. Each selection line is intersected with the first signal lines to form a first intersection and second intersections. Each selection line is electrically connected to the first signal line at the first intersection and electrically insulated to the first signal lines at the second intersections. Each selection line has a first portion and a second portion. The first portion is overlapped with the first signal line at the first intersection and separated from the second portion by a gap. The driving unit is electrically connected to the second signal lines and the first portions of the selection lines. Each metal line is overlapped with one of the gaps.

10 Claims, 5 Drawing Sheets

(56) References Cited

U.S. PATENT DOCUMENTS

| | | | |
|---|---|---|---|
| 8,563,980 B2* | 10/2013 | Liu | H01L 27/124 |
| | | | 257/59 |
| 8,723,758 B2* | 5/2014 | Li | G02F 1/13452 |
| | | | 345/55 |
| 9,276,055 B1 | 3/2016 | Son et al. | |
| 9,356,051 B2* | 5/2016 | Wu | H01L 27/124 |
| 9,569,993 B2* | 2/2017 | Wu | G09G 3/20 |
| 9,935,131 B2* | 4/2018 | Lv | H01L 27/124 |
| 2005/0140642 A1* | 6/2005 | Chiu | G02F 1/1345 |
| | | | 345/103 |
| 2010/0188378 A1* | 7/2010 | Chiang | G09G 3/3648 |
| | | | 345/206 |
| 2010/0295764 A1* | 11/2010 | Wang | G02F 1/136286 |
| | | | 345/92 |
| 2010/0296016 A1* | 11/2010 | Chen | G02F 1/136286 |
| | | | 349/38 |
| 2013/0141660 A1* | 6/2013 | Wang | G02F 1/136286 |
| | | | 349/43 |
| 2014/0043306 A1* | 2/2014 | Min | G09G 3/3685 |
| | | | 345/204 |
| 2015/0129880 A1* | 5/2015 | Wu | G09G 3/344 |
| | | | 257/72 |
| 2015/0206470 A1* | 7/2015 | Wu | G09G 3/20 |
| | | | 345/103 |
| 2015/0214246 A1* | 7/2015 | Wu | H01L 27/124 |
| | | | 257/347 |
| 2015/0378191 A1 | 12/2015 | Dong et al. | |
| 2016/0054636 A1* | 2/2016 | Chiang | G02F 1/167 |
| | | | 359/296 |

* cited by examiner

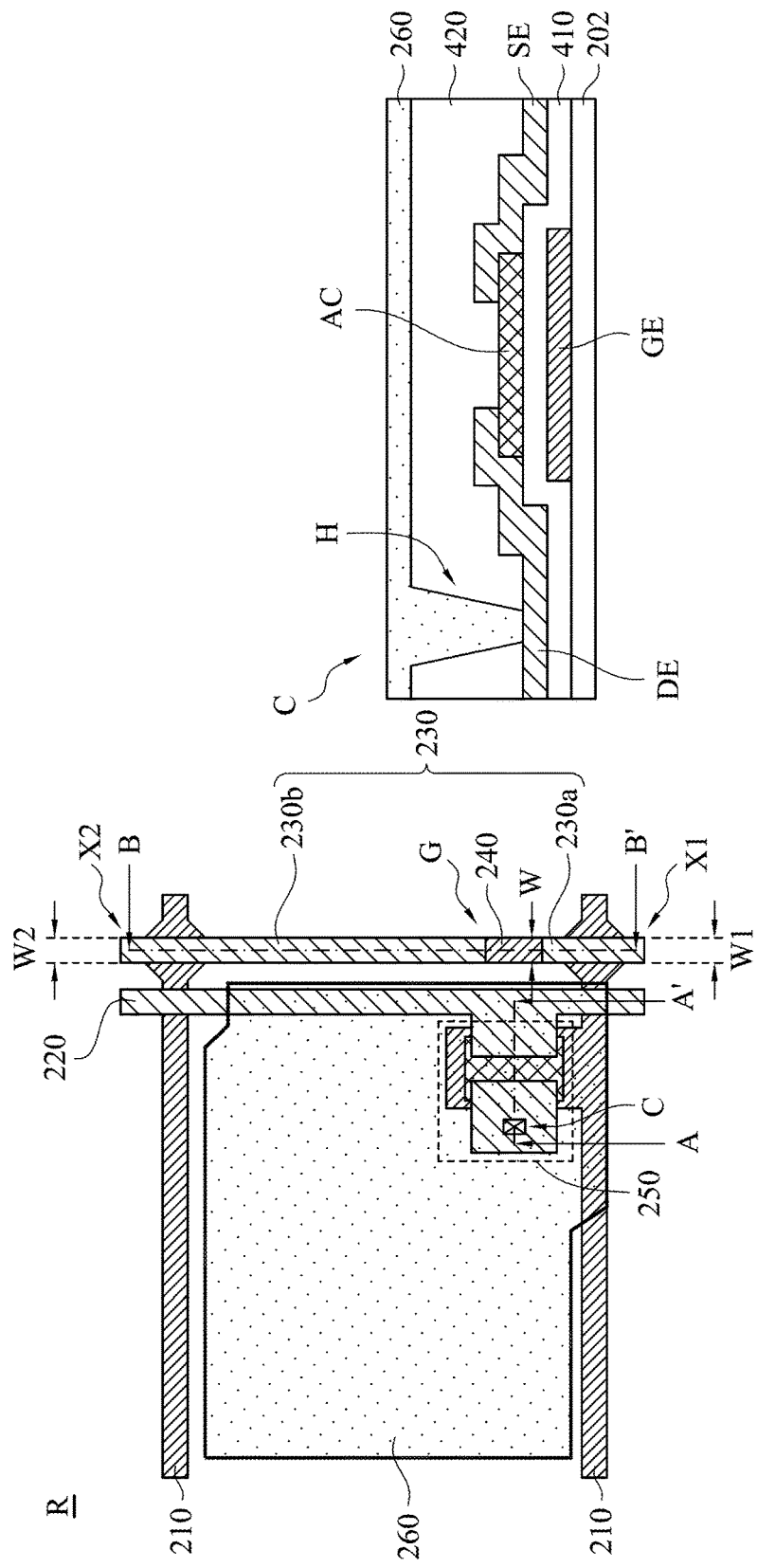

PIXEL ARRAY SUBSTRATE WITH DISCONTINUOUS SELECTION LINES

CROSS-REFERENCE TO RELATED APPLICATION

This application claims priority to China Application Serial Number 201611112401.1, filed Dec. 7, 2016, the disclosures of which are incorporated herein by reference in their entireties.

BACKGROUND

Field of Invention

The present invention relates to a pixel array substrate. More particularly, the present invention relates to a pixel array substrate having discontinuous selection lines.

Description of Related Art

With display panels being widely used in various display devices, e.g. televisions, laptops, tablet computers, electronic papers and mobile phones, those with a design of narrow border become a growing trend in the current display industry.

FIG. 1 is a partial diagram of a conventional pixel array. Two first signal lines, 110a and 110b, are intersected with a second signal line 120, as well as a selection line 130, forming a first intersection a1 and a second intersection a2. The first signal line 110a is electrically connected to the selection line 130 at the first intersection a1; therefore, signals from an outer signal source can be conveyed to the first signal line 110a through the selection line 130. The first signal line 110b is electrically insulated to the selection line 130 at the second intersection a2; nonetheless, the first signal line 110b can be still connected to the outer signal source through other selection lines (not shown here). The design of wire routing mentioned above facilitates that even when the second signal line 120 is electrically connected to a signal source (not shown here) below the pixel array shown in FIG. 1, the first signal line 110a can be also electrically connected to the signal source through the selection line 130. This wire routing excludes a requirement in traditional designs that the first signal line 110a should be wired to the signal source through the left side or the right side of FIG. 1. As a result, the design of narrow border can be achieved by applying the pixel array in FIG. 1.

However, the part of the selection line 130 extending from the first intersection a1 and over the second intersection a2 often causes mura for a display device fabricated from the pixel array of FIG. 1, degrading the display performance of the display device.

SUMMARY

The present disclosure provides a pixel array substrate. The pixel array substrate includes a substrate, a plurality of first signal lines, a plurality of second signal lines, a plurality of active elements, a plurality of pixel electrodes, a plurality of selection lines, a driving unit, and a plurality of metal lines. The plurality of first signal lines are disposed on the substrate. The plurality of second signal lines are disposed on the substrate, intersected with and electrically insulated to the first signal lines. Each active element is electrically connected to one of the first signal lines and one of the second signal lines. Each pixel electrode is electrically connected to one of the active elements. The plurality of selection lines are disposed on the substrate. Each selection line is intersected with the first signal lines to form a first intersection and a plurality of second intersections. Each selection line is electrically connected to the first signal line at the first intersection and electrically insulated to the first signal lines at the second intersections. Each selection line has a first portion and a second portion, and the first portion is overlapped with the first signal line at the first intersection and separated from the second portion by a gap. The driving unit is electrically connected to the second signal lines and the first portions of the selection lines. Each metal line is overlapped with one of the gaps.

In one embodiment of the present disclosure, a length of the each metal line is larger than or equal to a gap length of the gap overlapped with the each metal line.

In one embodiment of the present disclosure, the each metal line is overlapped with the first portion near the each metal line.

In one embodiment of the present disclosure, the each metal line is overlapped with the second portion near the each metal line.

In one embodiment of the present disclosure, the gap is between the first intersection and the second intersection near the first intersection.

In one embodiment of the present disclosure, the first signal lines and the metal lines are leveled.

In one embodiment of the present disclosure, a material of the metal lines is same as a material of the first signal lines.

In one embodiment of the present disclosure, the first portion of the each selection line has a width same as a width of the metal line near the first portion.

In one embodiment of the present disclosure, the second portion of the each selection line has a width same as a width of the metal line near the second portion.

In one embodiment of the present disclosure, the first signal lines are scan lines, and the second signal lines are data lines.

BRIEF DESCRIPTION OF THE DRAWINGS

The invention can be more fully understood by reading the following detailed description of the embodiment, with reference made to the accompanying drawings as follows:

FIG. 3 is an enlarged diagram of the region R in FIG. 2.

FIG. 4 is a cross sectional diagram along the section line A-A' in FIG. 3.

DETAILED DESCRIPTION

Figure 1:
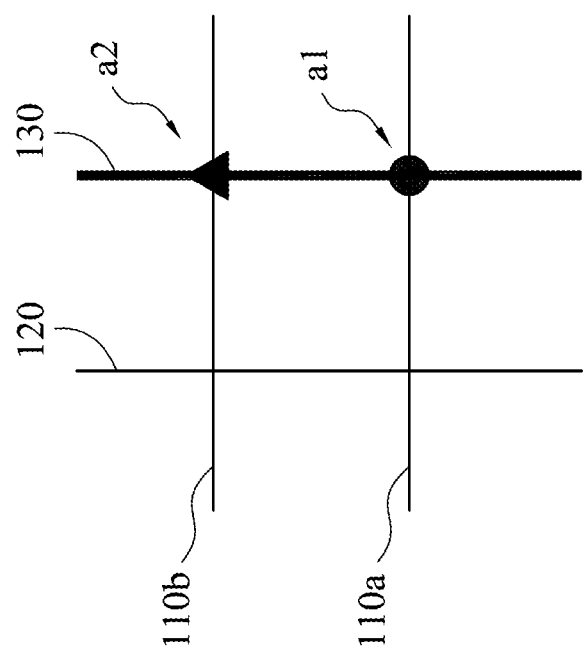
FIG. 1 is a partial diagram of a conventional pixel array.
Figure 2:
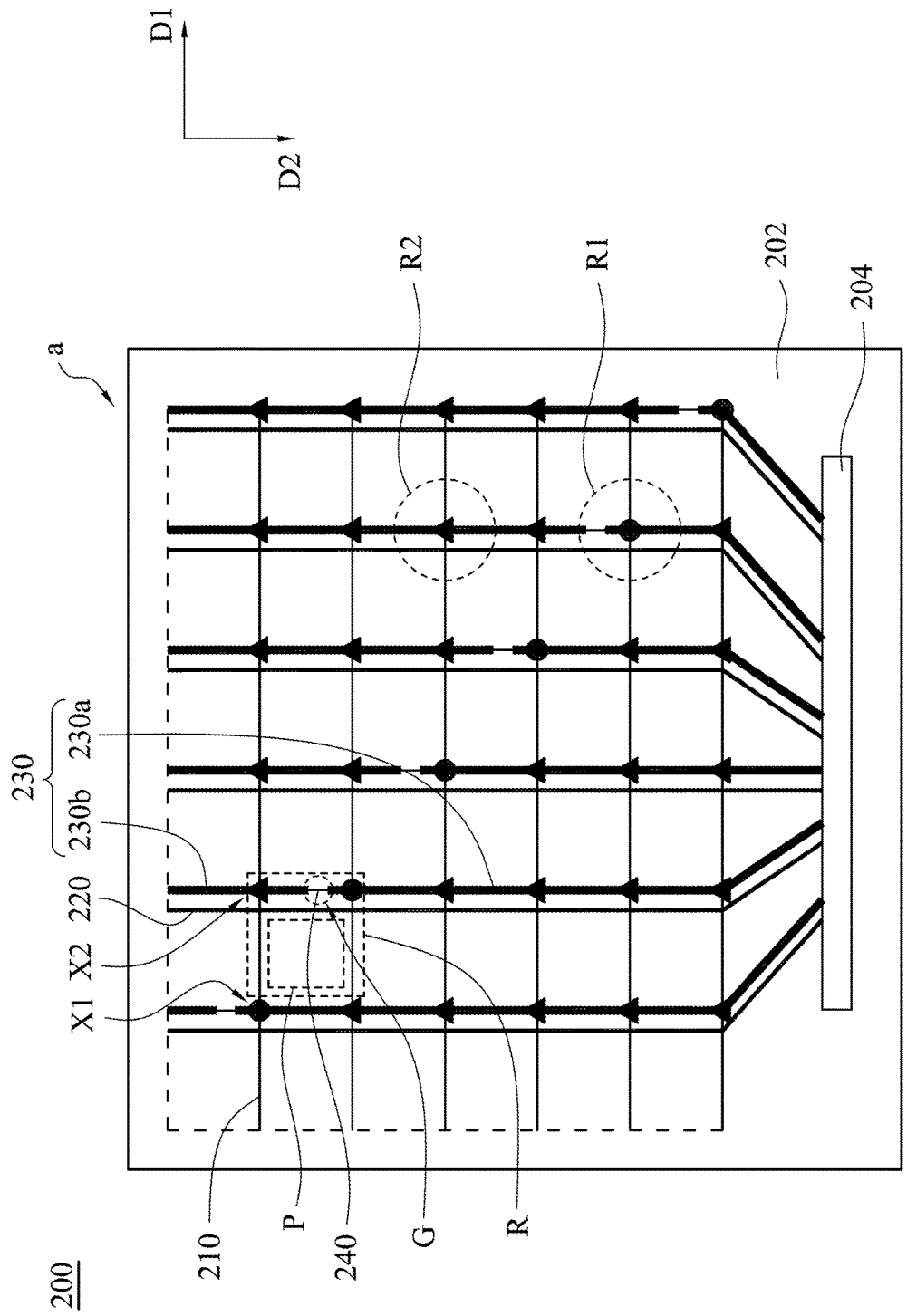
FIG. 2 is a top-down view diagram of a pixel array substrate according to one embodiment of the present disclosure.

FIG. 2 is a top-down view diagram of a pixel array substrate according to one embodiment of the present disclosure. FIG. 3 is an enlarged diagram of the region R in FIG. 2. Please refer to FIG. 2 and FIG. 3 that a pixel array substrate 200 includes a substrate 202, on which a driving unit 204, a plurality of first signal lines 210, a plurality of second signal lines 220, a plurality of selection lines 230, a plurality of metal lines 240, a plurality of active elements 250 and a plurality of pixel electrodes 260 are disposed. A pixel array a includes these first signal lines 210, second signal lines 220, selection lines 230, metal lines 240, active elements 250, and pixel electrodes 260.

As shown in FIG. 2 and FIG. 3, the first signal lines 210 and the second signal lines 220 are disposed on the substrate 202, and the second signal lines 220 are intersected with and electrically insulated to the first signal lines 210. Moreover, a plurality of pixel regions P are defined through the intersections between the first signal lines 210 and the second signal lines 220. Each active element 250 is disposed in one of these pixel regions P, and electrically connected to one of the first signal lines 210 and one of the second signal lines 220. Each pixel electrode 260 is electrically connected to one of the active elements 250.

In one embodiment, the first signal lines 210 extend along the first direction D1 and are arranged along the second direction D2. On the other hand, the second signal lines 220 extend along the second direction D2 and are arranged along the first direction D1. In one embodiment, the first direction is perpendicular to the second direction D2, but other general cases are also applicable.

Please refer to FIG. 2. Each of the selection lines 230 is intersected with the first signal lines 210 to form a first intersection X1 and a plurality of second intersections X2. The selection lines 230 are electrically connected to the first signal lines 210 at the first intersections X1, yet electrically insulated to the first signal lines 210 at the second intersections X2. Each selection line 230 includes a first portion 230a and a second portion 230b. The first portion 230a is overlapped with the first signal line 210 at the first intersection X1 and separated from the second portion 230b by a gap G. That is, the second portion 230b is not overlapped with the first intersection X1, and is electrically insulated to the first portion 230a. As shown in FIG. 2, the selection line 230 is a discontinuous selection line, of which the first portion 230a is electrically insulated to the second portion 230b by the gap G. Since the second portion 230b is not electrically connected to the first portion 230a and cannot receive signals from the driving unit 204, there is no problem of mura near the second portion 230b of the selection line 230 as the pixel array substrate 200 is disposed in a display device.

Besides, from FIG. 3, the gap G is between the first intersection X1 and the second intersection X2 near the first intersection X1. Namely, among those intersections X2 overlapped with the second portion 230b of the selection line 230, the second intersection X2 near the first intersection X1 is the closest intersection X2 to the first intersection X1. When the gap G is closer to the first intersection X1, the part of the first portion 230a extending from the first intersection X1 to the second intersection X2 is shorter, and the second portion 230b electrically insulated to the first portion 230a is longer, such that the mura problem can be avoided. In other embodiments, the gap G may be located between the first intersection X1 and other second intersections X2 overlapped with the second portion 230b of the selection line 230.

Furthermore, generally in processes of fabricating pixel array substrates, the automated optical inspection (AOI) is often utilized to examine from the top side of the pixel array, and investigate whether routing structures around different intersections are identical. If they are not identical, the pixel array would be concluded as having defects in the routing structures, and one cannot move to the next step of fabrication. As the pixel array substrate 200 shown in the FIG. 2, the existence of the gaps G makes the selection line 230 seem discontinuous. Nevertheless, since the pixel array substrate 200 includes the metal lines 240, and each metal lines 240 is overlapped with one of the gaps G, the routing structures around the intersections are similar enough to meet standards of the AOI examination. For instance, since the gap G is overlapped with the metal line 240, the routing structure around the first intersection X1 in the region R1 would be similar to the routing structure around the second intersection X2 in the region R2. Besides, the metal lines 240 are electrically insulated to the first portions 230a and the second portion 230b. Although in the top-down view diagram in FIG. 2, the metal lines 240 seem to connect to the first portions 230a and the second portions 230b, in fact, the metal lines 240 and the first portions 230a as well as the second portions 230b are disposed in different layers. Therefore, the metal lines 240 would not be electrically connected to the first portions 230a and the second portions 230b. The existence of the metal lines 240 would not cause the mura problem appearing in conventional techniques.

Hence, to make the routing structures around different intersections consistent, the shape of the metal line 240 should be identical or similar to the shape of the gap G. For example, the length of the metal line 240 should be larger than or equal to the gap length, GL, of the gap G (please refer to FIGS. 5A-5D), and the width W of the metal line 240 should be equal to the widths W1, W2 of the first portion 230a as well as the second portion 230b of selection line 230, making the routing structures around the first intersection X1 and the second intersection X2 look similar. In one embodiment, the length of the each metal line 240 is larger than or equal to the gap length GL of the gap G overlapped with the each metal line 240. In one embodiment, the first portion 230a of the each selection line 230 has a width W1 same as a width W of the metal line 240 near the first portion 230a. In another embodiment, the second portion 230b of the selection line 230 has a width W2 same as a W width of the metal line 240 near the second portion 230b.

As shown in FIG. 2, the driving unit 204 is disposed on the substrate 202 and electrically connected to the second signal lines 220 as well as the first portions 230a of the selection lines 230. Since the first portions 230a of the selection lines 230 are electrically connected to the first signal lines 210 at the first intersections X1, the selection lines 230 can convey signals from the driving unit 204 to the first signal lines 210.

In the following, please refer to FIG. 3 and FIG. 4 simultaneously. FIG. 4 is a cross sectional diagram along the section line A-A' in FIG. 3. The active element 250 includes a gate electrode GE, an active layer AC, a source electrode SE and a drain electrode DE. The gate electrode GE is disposed on the substrate 202, the active layer AC is disposed on the gate electrode GE, and the source electrode SE and the drain electrode DE are disposed on the active layer AC. The active element 250 can further include an insulated layer 410 which is disposed between the gate electrode GE and the active layer AC, and covers the gate electrode GE and the substrate 202. The active element 250 can further include a protective layer 420, and the drain electrode DE can be electrically connected to the pixel electrode through an opening H of the protective layer 420. In FIG. 3, a connection C is utilized to illustrate the position of the electrical connection between the drain electrode DE and the pixel electrode 260.

In FIG. 3, the first signal line 210 is electrically connected to the gate electrode GE, and the second signal line 220 is electrically connected to the source electrode SE; therefore, the first signal line 210 is a scan line, and the second signal line 220 is a data line. The first signal line 210 is electrically connected to the selection line 230 to convey signals of the driving unit 204 to the gate electrode GE. In another embodiment, a gate electrode of an active element is electrically connected to the second signal line 220, and a source electrode of the active element is electrically connected to the first signal line 210; therefore, in this embodiment, the first signal line 210 is a data line, and the second signal line 220 is a scan line. The first signal line 210 is electrically connected to the selection line 230 to convey signals of the driving unit 204 to the source electrode.

In the following, please refer to FIGS. 5A-5D. FIGS. 5A-5D are cross sectional diagrams along the section line B-B' in FIG. 3 according to the different embodiments of the present disclosure. Since the difference between FIGS. 5A-5D lies in different lengths of the metal lines, for clearly illustrating the metal lines in different figures, the metal lines in FIGS. 5A-5D are relabeled as 240a, 240b, 240c, and 240d.

Figure 5A:
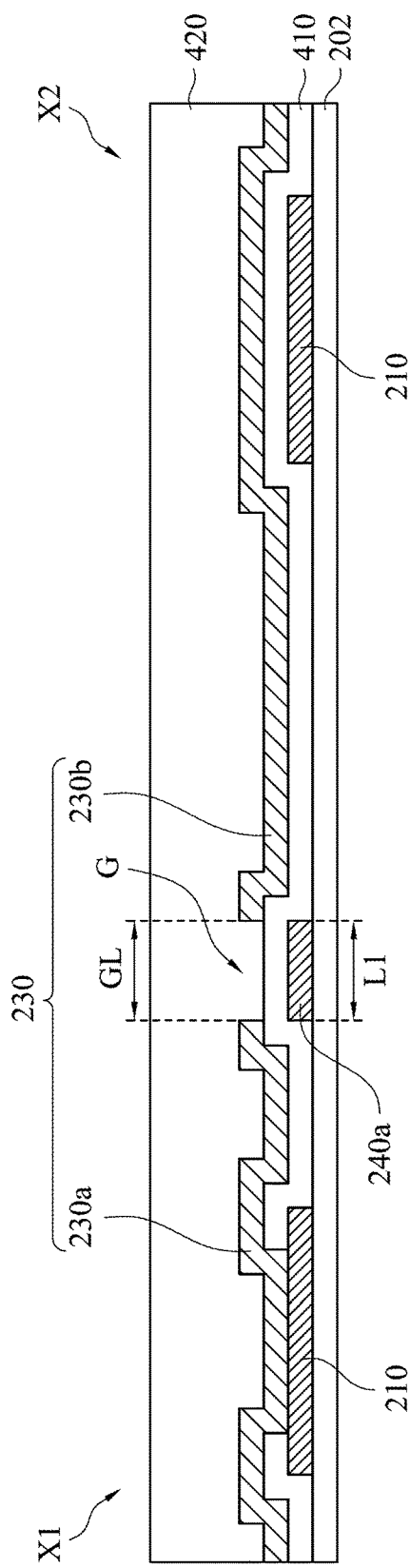
FIGS. 5A-5D are cross sectional diagrams along the section line B-B' in FIG. 3 according to the different embodiments of the present disclosure.

As shown in FIG. 5A, the length L1 of the metal line 240a is equal to the gap length GL of the gap G which is overlapped with the metal line 240a. One end of the metal line 240a is aligned with the end of the first portion 230a near the metal line 240a, and the other end of the metal line 240a is aligned with the end of the second portion 230b near the metal line 240a. That is, the metal line 240a is not overlapped with the first portion 230a or the second portion 230b.

Additionally, the first signal line 210 and the metal line 240a are leveled, which can be observed in FIG. 5A. In one embodiment, after a metal layer is fabricated onto the substrate 202, pattern formations of the metal layer are then performed to form the first signal line 210 and the metal line 240a. Thus, the material of the metal line 240 is same as the material of the first signal line 210.

Figure 5B:
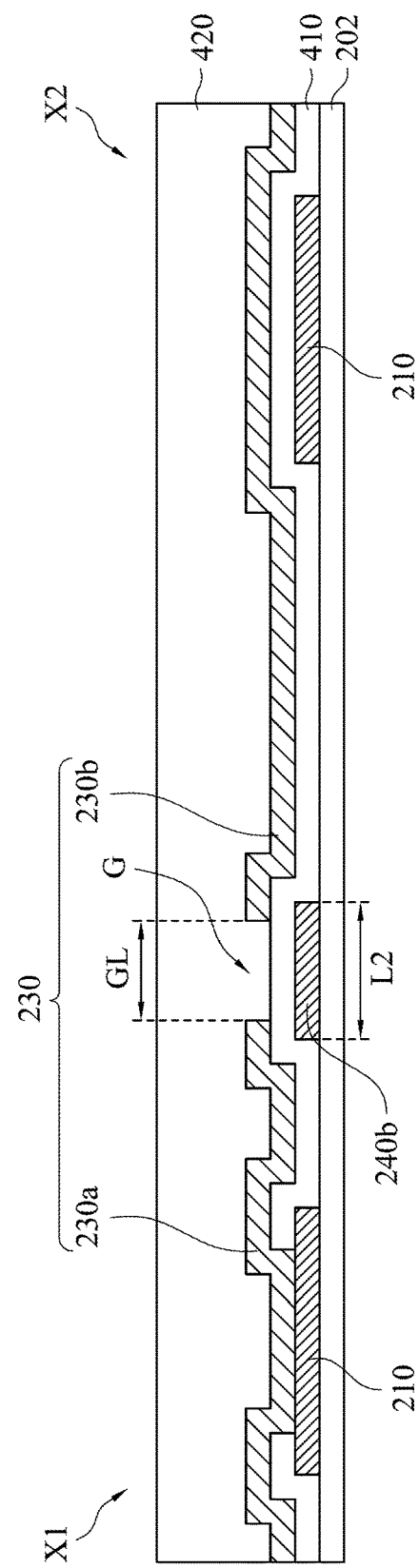
Figure 5C:
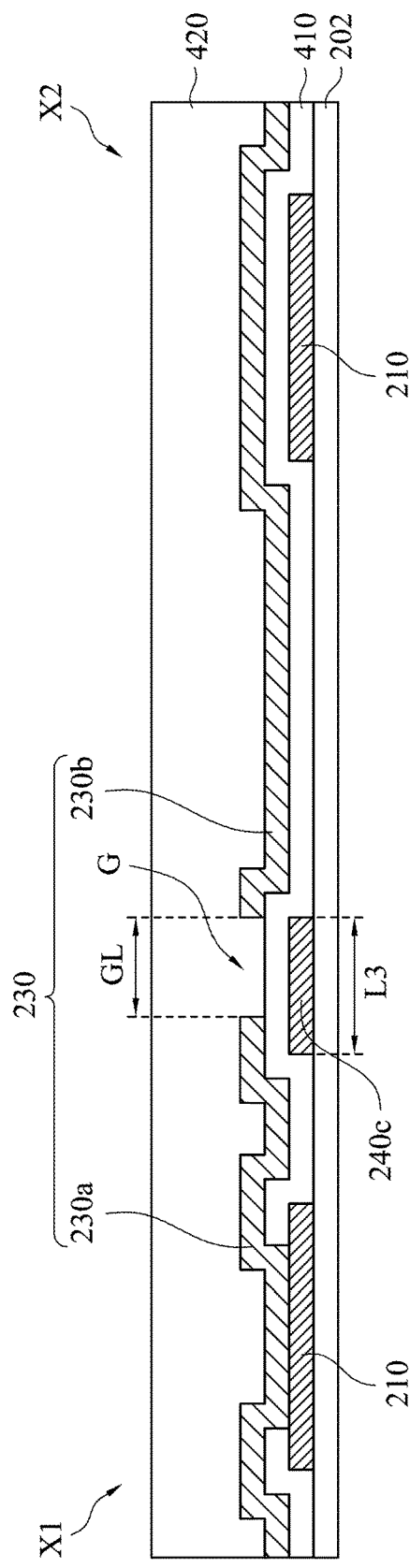
Figure 5D:
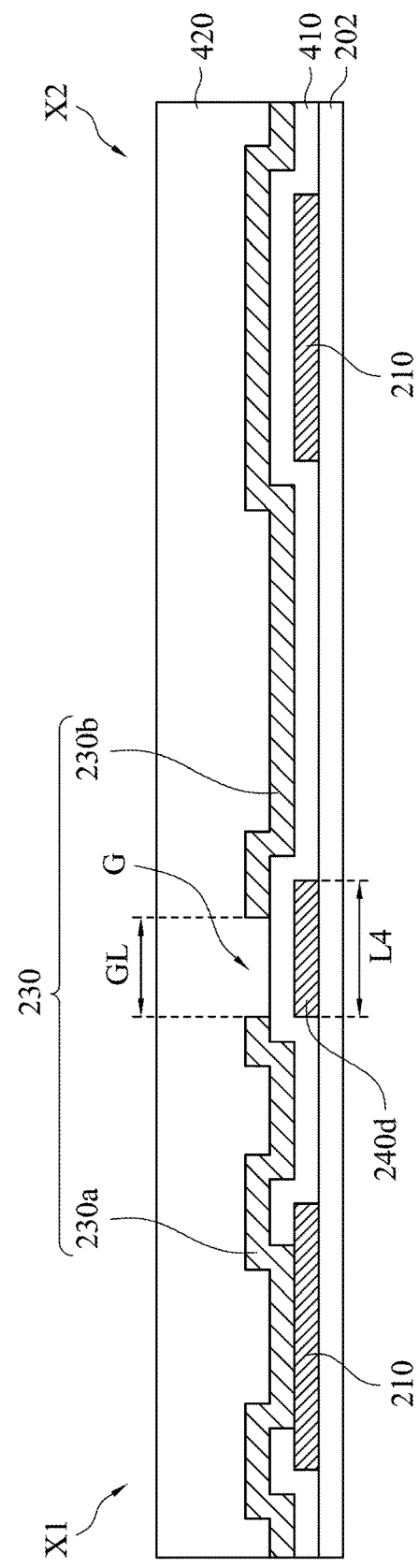

In FIGS. 5B-5D, the metal lines, 240b, 240c and 240d, respectively have a length larger than the gap lengths GL of the gaps G, which are overlapped with each metal line. As shown in FIG. 5B, the length L2 of the metal line 240b is larger than the gap length GL, and the metal line 240b is overlapped with the first portion 230a as well as the second portion 230b of the selection line 230 near the metal line 240b. As shown in FIG. 5C, the length L3 of the metal line 240c is larger than the gap length GL, and the metal line 240c is overlapped with the first portion 230a of the selection line 230 near the metal line 240c. One end of the metal line 240c is aligned with the end of the second portion 230b near the metal line 240c. As shown in FIG. 5D, the length L4 of the metal line 240d is larger than the gap length GL, and the metal line 240d is overlapped with the second portion 230b of the selection line 230 near the metal line 240d. One end of the metal line 240d is aligned with the end of the first portion 230a near the metal line 240d.

In FIGS. 5A-5D mentioned above, the metal lines, 240a, 240b, 240c and 204d, are all disposed under the selection line 230. As a result, in the top-down view diagram of FIG. 3, parts of the metal lines, 240a, 240b, 240c and 240d, exposed through the gaps G are of the same length. Nonetheless, the positions of the metal lines are not limited to the embodiments shown in FIGS. 5A-5D of the present disclosure. In other embodiments, the metal lines are disposed on the selection line 230.

In conclusion, the pixel array substrate of the present disclosure includes metal lines and discontinuous selection lines including first portions and second portions. The first portions and the second portions are separated by gaps which are overlapped with the metal lines, and the metal lines are electrically insulated to the first portions as well as the second portions. The disposition of the metal lines makes routing structures around every intersection of the pixel array of the pixel array substrate consistent from the top-down view, meeting standards of the AOI examination. Accordingly, in the processes of fabricating the pixel array substrate of the present disclosure, there is no need to adjust current AOI equipment or testing parameters.

Moreover, the pixel array substrate of the present disclosure can be disposed in various display devices, and resolves the mura problem appearing in conventional techniques. The display devices include such as the electrophoretic display which can contain the pixel array substrate of the present disclosure and an electrophoretic display film disposed on the substrate. Display outputs can be achieved through the pixel array substrate driving display particles of the electrophoretic display film. The discontinuous selection lines of the pixel array substrate in the present disclosure make the color and the brightness of the display outputs homogeneous, leading to high-quality displays.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A pixel array substrate, comprising:
   a substrate;
   a plurality of first signal lines disposed on the substrate;
   a plurality of second signal lines disposed on the substrate, intersected with and electrically insulated from the first signal lines;
   a plurality of active elements, each active element electrically connected to one of the first signal lines and one of the second signal lines;
   a plurality of pixel electrodes, each pixel electrode electrically connected to one of the active elements;
   a plurality of selection lines disposed on the substrate, each selection line intersected with the first signal lines to form a first intersection and a plurality of second intersections, each selection line electrically connected to the first signal line at the first intersection and electrically insulated to the first signal lines at the second intersections, each selection line having a first portion and a second portion, the first portion on and overlapped with the first signal line at the first intersection and separated from the second portion by a gap;
   a driving unit electrically connected to the second signal lines and the first portions of the selection lines; and
   a plurality of metal lines, each metal line under and overlapped with one of the gaps and electrically insulated from the selection lines.

2. The pixel array substrate of claim 1, wherein a length of the each metal line is larger than or equal to a gap length of the gap over and overlapped with the each metal line.

3. The pixel array substrate of claim 1, wherein the each metal line is under and overlapped with the first portion adjacent to the each metal line.

4. The pixel array substrate of claim 1, wherein the each metal line is under and overlapped with the second portion adjacent to the each metal line.

5. The pixel array substrate of claim 1, wherein the gap is between the first intersection and the second intersection adjacent to the first intersection.

6. The pixel array substrate of claim 1, wherein the first signal lines and the metal lines are coplanar.

7. The pixel array substrate of claim 1, wherein a material of the metal lines is same as a material of the first signal lines.

8. The pixel array substrate of claim 1, wherein the first portion of the each selection line has a width same as a width of the metal line adjacent to the first portion.

9. The pixel array substrate of claim 1, wherein the second portion of the each selection line has a width same as a width of the metal line adjacent to the second portion.

10. The pixel array substrate of claim 1, wherein the first signal lines are scan lines, and the second signal lines are data lines.

* * * * *